(12) United States Patent
Drost et al.

(10) Patent No.: US 6,925,411 B1
(45) Date of Patent: Aug. 2, 2005

(54) METHOD AND APPARATUS FOR ALIGNING SEMICONDUCTOR CHIPS USING AN ACTIVELY DRIVEN VERNIER

(75) Inventors: Robert J. Drost, Mountain View, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/741,961

(22) Filed: Dec. 19, 2003

Related U.S. Application Data

(60) Provisional application No. 60/460,109, filed on Apr. 2, 2003.

(51) Int. Cl.[7] ............................................. G01C 17/00
(52) U.S. Cl. ........................ 702/150; 700/125; 33/1 D; 340/870.37; 257/797; 438/975
(58) Field of Search ........................ 702/150; 700/125; 33/1 D; 340/870.37; 257/797; 438/975

(56) References Cited

U.S. PATENT DOCUMENTS

| | | | | |
|---|---|---|---|---|
| 4,386,459 A | * | 6/1983 | Boulin | 438/11 |
| 4,566,193 A | * | 1/1986 | Hackleman et al. | 33/1 D |
| 5,198,740 A | * | 3/1993 | Jacobsen et al. | 318/687 |
| 5,936,411 A | | 8/1999 | Jacobsen et al. | 324/662 |
| 5,977,781 A | * | 11/1999 | Jordil | 324/658 |
| 6,221,681 B1 | * | 4/2001 | Sugasawara | 438/14 |
| 6,518,679 B2 | * | 2/2003 | Lu et al. | 257/797 |
| 6,647,311 B1 | * | 11/2003 | Goff | 700/125 |

* cited by examiner

Primary Examiner—John Barlow
Assistant Examiner—Anthony T. Dougherty
(74) Attorney, Agent, or Firm—Park, Vaughan & Fleming LLP

(57) ABSTRACT

One embodiment of the present invention provides a system that facilitates measuring an alignment between a first semiconductor die and a second semiconductor die. The system provides a plurality of conductive elements on the first semiconductor die and a plurality of conductive elements on the second semiconductor die. The plurality of conductive elements on the second semiconductor die have a different spacing than the plurality of conductive elements on the first semiconductor die, so that when the plurality of conductive elements on the first semiconductor die overlap the plurality of conductive elements on the second semiconductor die, a vernier alignment structure is created between them. The system also provides a charging mechanism configured to selectively charge each of the plurality of conductive elements on the first semiconductor die, wherein charging a conductive element on the first semiconductor die induces a charge in one or more conductive elements on the second semiconductor die. An amplification mechanism then amplifies the signals induced in the conductive elements on the second semiconductor die. These signals can be analyzed to determine the alignment between the first semiconductor die and the second semiconductor die.

21 Claims, 4 Drawing Sheets

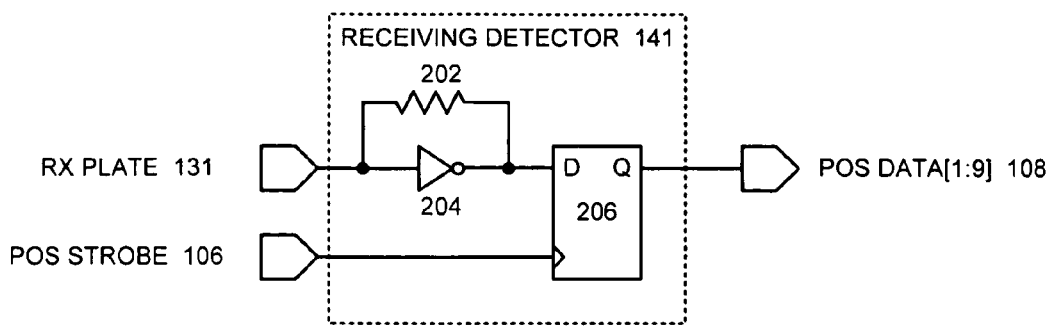
FIG. 2
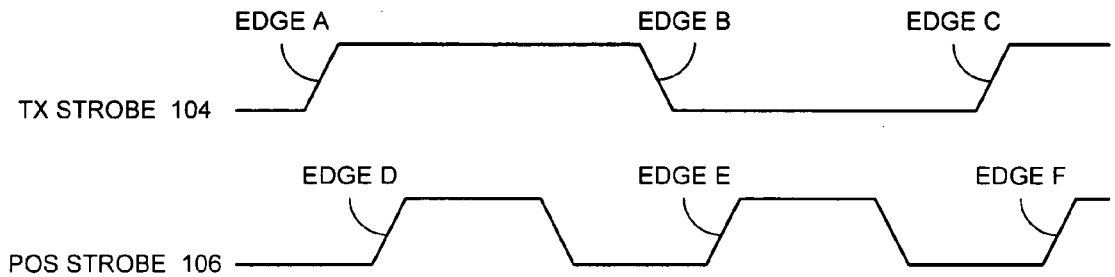
FIG. 3
CTL[1:8] 102    1 1 1 1 0 0 0 0          COARSE
POS DATA[1:9] 108    1 1 1 1 X 0 0 0 0    MODE
FIG. 4A
CTL[1:8] 102    1 0 1 0 1 0 1 0          FINE
POS DATA[1:9] 108    1 0 1 0 X 1 0 1 0   MODE
FIG. 4B

METHOD AND APPARATUS FOR ALIGNING SEMICONDUCTOR CHIPS USING AN ACTIVELY DRIVEN VERNIER

RELATED APPLICATION

This application hereby claims priority under 35 U.S.C. §119 to U.S. Provisional Patent Application No. 60/460,109 filed on 2 Apr. 2003, entitled "Actively Driven Verniers Content-Length," by inventors Robert J. Drost and Ivan E. Sutherland.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to semiconductor dies. More specifically, the present invention relates to a method and an apparatus for aligning semiconductor dies using an actively driven vernier.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to align the chips properly. It is possible to align the chips by assigning a charge to plates on one chip, and detecting a specific pattern of charges that are induced in plates on a facing chip. However, this technique has problems. First, because of the miniscule size of the plates, it is difficult to get an accurate reading of the induced charges on the opposite chip. Second, while this technique works well for linear alignment, it can be extremely difficult to get meaningful results if one chip is rotated even slightly with respect to the other chip.

What is needed is a method and an apparatus for aligning semiconductor chips with each other to facilitate capacitive inter-chip communications without the problems listed above.

SUMMARY

One embodiment of the present invention provides a system that facilitates measuring an alignment between a first semiconductor die and a second semiconductor die. The system provides a plurality of conductive elements on the first semiconductor die and a plurality of conductive elements on the second semiconductor die. The plurality of conductive elements on the second semiconductor die have a different spacing than the plurality of conductive elements on the first semiconductor die, so that when the plurality of conductive elements on the first semiconductor die overlap the plurality of conductive elements on the second semiconductor die, a vernier alignment structure is created between them. The system also provides a charging mechanism configured to selectively charge each of the plurality of conductive elements on the first semiconductor die, wherein charging a conductive element on the first semiconductor die induces a charge in one or more conductive elements on the second semiconductor die. An amplification mechanism then amplifies the signals induced in the conductive elements on the second semiconductor die. These signals can be analyzed to determine the alignment between the first semiconductor die and the second semiconductor die.

In a variation on this embodiment, the charging mechanism is configured to assign different patterns of charges to the plurality of conductive elements on the first semiconductor die to achieve different resolutions in alignment between the first semiconductor die and the second semiconductor die.

In a further variation, the charging mechanism assigns charges to the plurality of conductive elements on the first semiconductor die in a pattern that facilitates coarse resolution of alignment between the first semiconductor die and the second semiconductor die. Upon reaching a coarse alignment, the charging mechanism assigns charges to the plurality of conductive elements on the first semiconductor die in a pattern that facilitates fine resolution of alignment between the first semiconductor die and the second semiconductor die.

In a further variation, the pattern that facilitates coarse resolution assigns charges of the same polarity to groups of adjacent conductive elements.

In a further variation, the pattern that facilitates fine resolution assigns charges of alternating polarity to adjacent conductive elements.

In a further variation, the plurality of conductive elements on the first semiconductor die and the plurality of conductive elements on the second semiconductor die are rectangular in shape.

In a variation on this embodiment, the analysis mechanism also determines rotational alignment between the first semiconductor die and the second semiconductor die.

In a further variation, the vernier alignment structure includes a first vernier alignment structure and a second vernier alignment structure, wherein the first vernier alignment structure is spatially separated from the second vernier alignment structure. In this variation, the analysis mechanism is further configured to determine rotational alignment between the first semiconductor die and the second semiconductor die by comparing the amplified signals from the first vernier alignment structure and the second vernier alignment structure. In this variation, there exists a difference in alignment between the first vernier alignment structure and the second vernier alignment structure when the first semiconductor die is rotationally misaligned relative to the second semiconductor die.

BRIEF DESCRIPTION OF THE FIGURES

FIG. 2 illustrates a receiving detector in accordance with an embodiment of the present invention.

FIG. 3 illustrates a timing diagram in accordance with an embodiment of the present invention.

FIG. 4A illustrates measurement data in coarse mode in accordance with an embodiment of the present invention.

FIG. 4B illustrates measurement data in fine mode in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Actively Driven Vernier

Figure 1:
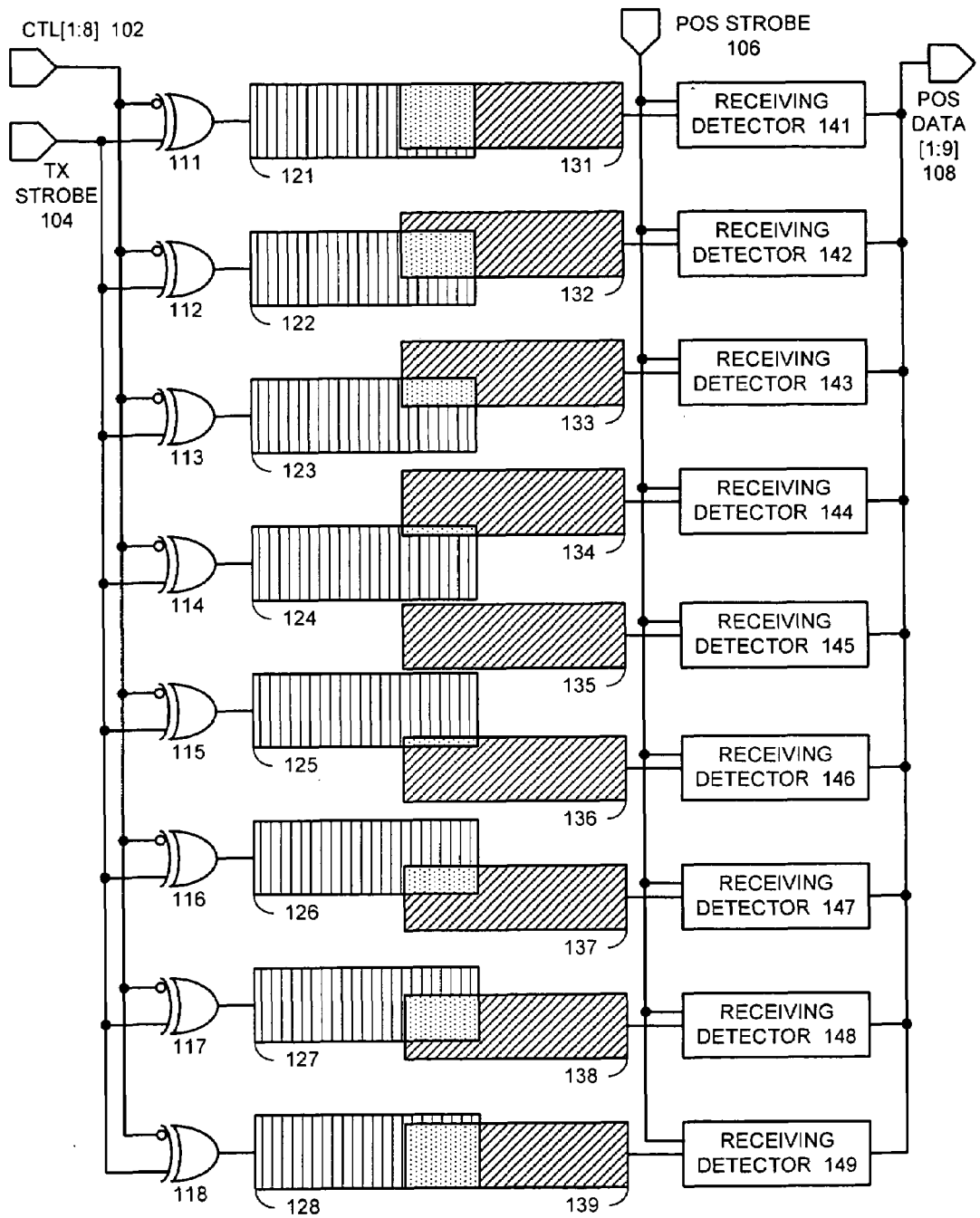
FIG. 1 illustrates an actively driven vernier in accordance with an embodiment of the present invention.

FIG. 1 illustrates an actively driven vernier in accordance with an embodiment of the present invention. The vertical-striped rectangles, transmitter plates 121–128, represent vernier plates on the transmitting side of the system. The 45-degree-striped rectangles, receiver plates 131–139, represent vernier plates on the receiving side of the system. The areas shaded with dots represent the areas where receiver plates 131–139 overlap transmitter plates 121–128. During a measurement, transmitter plates 121–128 and receiver plates 131–139 are placed in close proximity so that they are capacitively coupled. Note that receiver plates 131–139 are ideally situated further to the left so they cover transmitter plates 121–128 more completely. Transmitter plates 121–128 and receiver plates 131–139 have been pulled apart for purposes of illustration.

On the transmitter side of the system, the transmit circuit comprises an array of exclusive-OR gates 111–118. Each exclusive-OR gate receives TxStrobe signal 104 and one of the Ctl[1:8] signals 102. Exclusive-OR gates 111–118 invert TxStrobe signal 104 if the Ctl[1:8] signal 102 is low. Otherwise, they do not invert TxStrobe signal 104.

On the receiver side of the system, the receiving detectors amplify small voltages on receiver plates 131–139 to digital signal levels. PosStrobe signal 106 controls the time at which receiving detectors 141–149 sample the plate voltages and output the data to Pos data[1:9] lines 108.

Receiving Detector

FIG. 2 illustrates the internal structure of receiving detector 141 in accordance with an embodiment of the present invention. Receiving detector 141 takes an input from receiver plate 131 as well as an input from PosStrobe signal 106. The input from receiver plate 131 feeds into inverter 204 whose input voltage is biased through feedback resistor 202 to its threshold voltage. During operation, inverter 204 amplifies the signal from receiver plate 131 and stores the signal on D-flip flop 206 when PosStrobe signal 106 is asserted.

On the sending side, a transition on TxStrobe signal 104 causes a small voltage step on receiver plates 131–139. Ctl[1:8] signals 102, the polarity of TxStrobe signal 104, and the position of receiver plates 131–139 relative to transmitter plates 121–128 determine the polarity of the voltage step. TxStrobe signal 104 and the polarity of Ctl[1:8] signals 102 determine whether a given transmitter plate has a rising or falling edge. If a receiver plate is center under a transmitter plate, then the voltage step polarity will match the transmitter plate transition polarity. If a receiver plate sits between two transmitter plates that transition in opposite directions, then the receiver plate's net voltage step polarity will match that of the closer transmitter plate.

Timing Diagram

FIG. 3 illustrates a timing diagram for TxStrobe signal 104 and PosStrobe signal 106 in accordance with an embodiment of the present invention. After each transition of TxStrobe signal 104, PosStrobe signal 106 has a rising edge. This rising edge triggers D-flip flop 206 to output a digital level indicating the polarity of the voltage step seen on the corresponding receiver plate. In FIG. 3, note that the polarity is measured for each of Edges A, B, and C. The measured polarity will flip for successive edges because the polarity of TxStrobe signal 104 flips. In another embodiment of the present invention, the polarity may be measured only for Edges A and C. In this embodiment, the polarity will be the same for each measurement.

Measurement Data in Coarse Mode

FIG. 4A illustrates measurement data in coarse mode in accordance with an embodiment of the present invention. In the coarse mode, only the bottom four transmitter plates, transmitter plates 125–128, controlled by Ctl[5:8] signals 102, carry an inverted version of TxStrobe signal 104. When receiver plates 131–139 are centered with transmitter plates 121–128, the bottom four Pos data[6:9] signals 108 will be low, and the top four Pos data[1:4] signals 108 will be high. The middle Pos data[5] signal 108 will be high or low based on whether receiver plates 131–139 are off-center shifted up or down, respectively.

In FIG. 4A, the position sensitivity of Pos data[5] signal 108 is represented by the "X" value. In the actual system, Pos data[5] signal 108 will have a value of either 0 or 1. If receiver plates 131–139 are shifted by one or more multiples of the receiver plate pitch, then the "X" uncertain data bit will shift one or more bit positions in the Pos data[1:9] signals 108 vector. The bit position in the Pos data[1:9]

signals at which the value changes from 1 to 0 gives the coarse position measurement.

Measurement Data in Fine Mode

FIG. 4B illustrates measurement data in fine mode in accordance with an embodiment of the present invention. In the fine mode, Ctl[1:8] signals 102 alternate in successive positions, so that adjacent transmitter plate signals transition in opposite directions. In this mode, each receiver plate couples to both positive and negative polarity transitions when TxStrobe signal 104 flips. If receiver plates 131–139 are centered beneath transmitter plates 121–128, then Pos data[5] signal 108 can be either high or low, continuing the 1010 pattern from either Pos data[1:4] signals 108 or Pos data[6:9] signals 108 respectively.

In fine mode, a fraction of a receiver plate pitch misalignment from center causes Pos data[4] signal 108 or Pos data[6] signal 108 to become the uncertain, or "X" valued bit. A shift of one receiver plate pitch (from –½ plate pitch to +½ plate pitch) causes all of the Pos data[1:9] signals 108 to change polarity. For this configuration of transmitter plates 121–128 and receiver plates 131–139, the fine mode has eight times higher resolution than the coarse mode.

Note that any number of transmitter and receiver plates may be used. In one embodiment of the present invention, extra receiver plates are used to facilitate finding an initial position measurement. Also note that between coarse mode and fine mode, there can be other patterns. For instance, Ctl[1:8] signals 102 can be set to 00110011 to obtain a position measurement with half the resolution of fine mode.

Rotational Alignment

Figure 7:
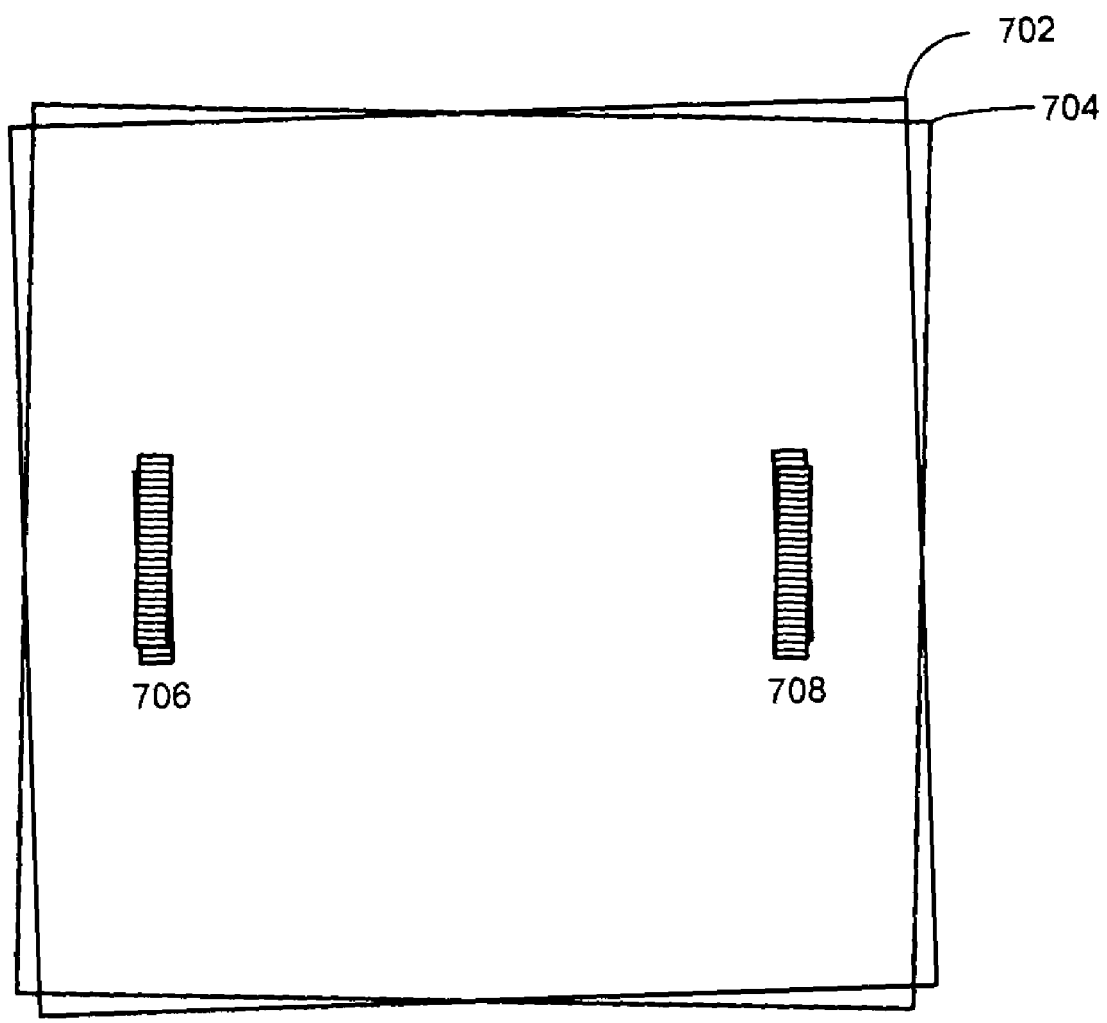
FIG. 7 illustrates two spatially separated vernier alignment structures in accordance with an embodiment of the present invention.

In one embodiment of the present invention, the vernier alignment structure includes a first vernier alignment structure 706 and a second vernier alignment structure 708, which are spatially separated from each other (see FIG. 7). In this embodiment, the system is configured to determine rotational alignment between the first semiconductor die 702 and the second semiconductor die 704 by comparing the amplified signals from the first vernier alignment structure 706 and the second vernier alignment structure 708.

As is illustrated in FIG. 7, because of the spatial separation between the first vernier alignment structure 706 and the second vernier alignment structure 708, there exists a difference in alignment between the first vernier alignment structure 706 and the second vernier alignment structure 708 when the first semiconductor die 702 is rotationally misaligned relative to the second semiconductor die 704.

Receiving Detector with Dead Zone Latch

Figure 5:
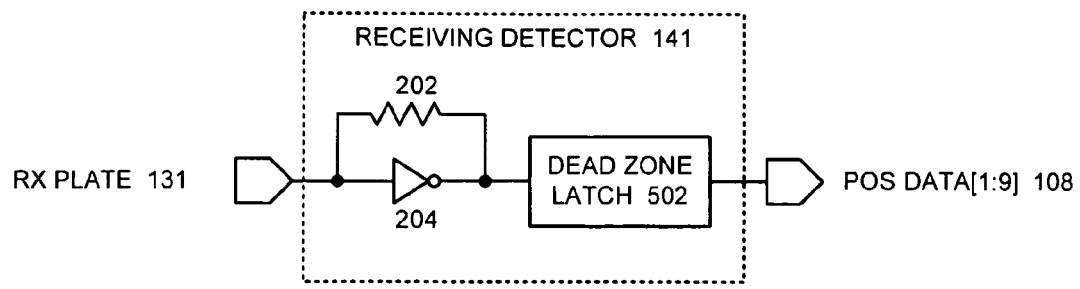
FIG. 5 illustrates a receiving detector with dead zone latch in accordance with an embodiment of the present invention.

FIG. 5 illustrates another embodiment of the present invention in which receiving detector 141 includes dead zone latch 502. Dead zone latch 502 changes state when receiver plate 131 experiences enough voltage to flip the state of dead zone latch 502.

Dead Zone Latch

Figure 6:
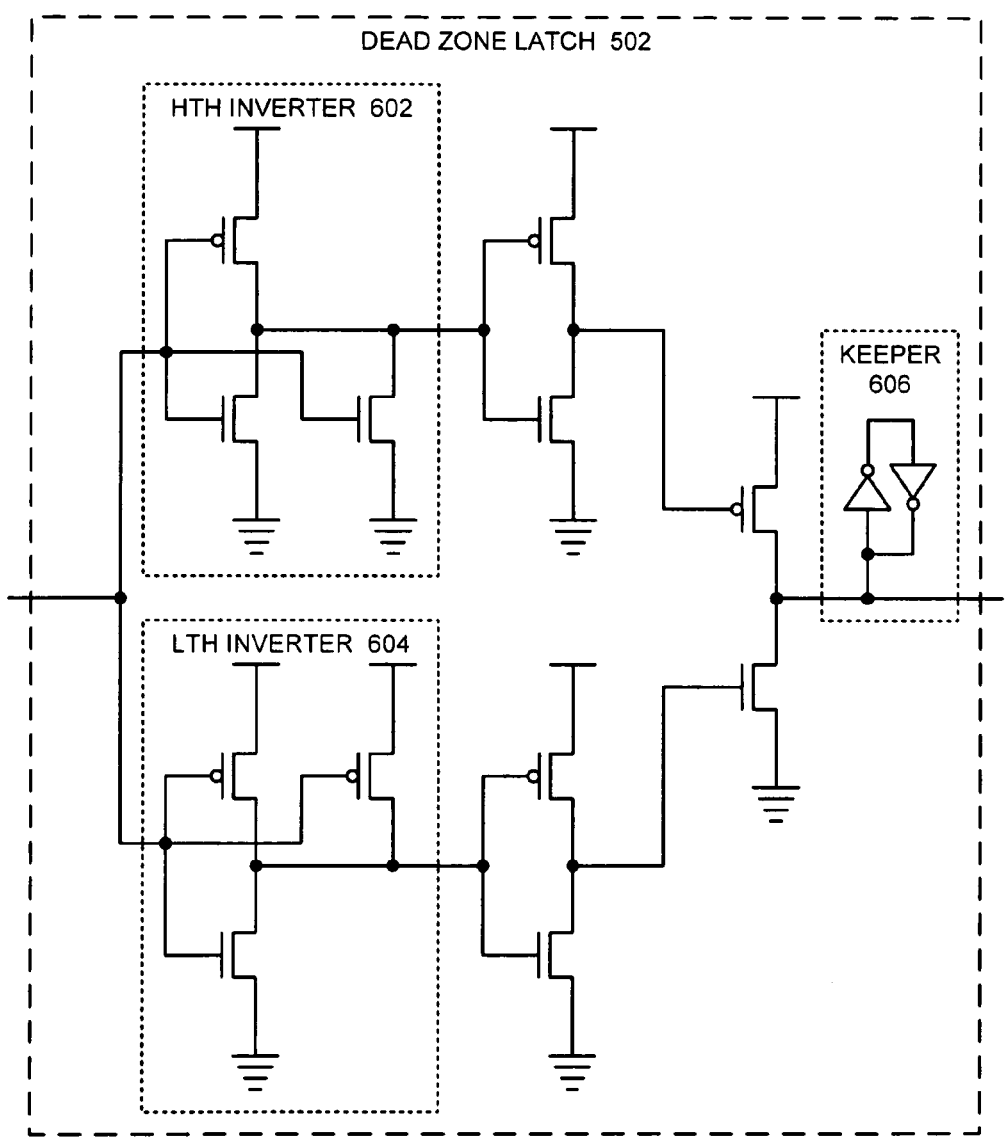
FIG. 6 illustrates an implementation of a dead zone latch in accordance with an embodiment of the present invention.

FIG. 6 illustrates an implementation of a dead zone latch in accordance with an embodiment of the present invention. Dead zone latch 502 comprises high-threshold inverter 602, low-threshold inverter 604, and keeper 606. High-threshold inverter 602 drives the output signal high when the input signal rises above the threshold value. Likewise, low-threshold inverter 604 drives the output signal low when the input signal falls below the threshold value. Keeper 606 maintains the output signal until a change in the input signal that is great enough to flip the latch occurs.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that measures an alignment between a first semiconductor die and a second semiconductor die, comprising:
   a plurality of conductive elements on the first semiconductor die;
   a plurality of conductive elements on the second semiconductor die, wherein the plurality of conductive elements on the second semiconductor die have a different spacing than the plurality of conductive elements on the first semiconductor die, whereby a vernier alignment structure is created when the plurality of conductive elements on the first semiconductor die overlap the plurality of conductive elements on the second semiconductor die;
   a charging mechanism configured to selectively charge each of the plurality of conductive elements on the first semiconductor die, wherein charging a conductive element on the first semiconductor die induces a charge in one or more conductive elements on the second semiconductor die when the conductive element on the first semiconductor die overlaps one or more conductive elements on the second semiconductor die;
   an amplification mechanism configured to amplify signals induced in the conductive elements on the second semiconductor die; and
   an analysis mechanism configured to analyze the amplified signals to determine the alignment between the first semiconductor die and the second semiconductor die.

2. The apparatus of claim 1, wherein the plurality of conductive elements on the first semiconductor die and the plurality of conductive elements on the second semiconductor die are rectangular in shape.

3. The apparatus of claim 1, wherein the analysis mechanism is further configured to determine rotational alignment between the first semiconductor die and the second semiconductor die.

4. The apparatus of claim 3,
   wherein the vernier alignment structure includes a first vernier alignment structure and a second vernier alignment structure, wherein the first vernier alignment structure is spatially separated from the second vernier alignment structure;
   wherein the analysis mechanism is further configured to determine rotational alignment between the first semiconductor die and the second semiconductor die by comparing the amplified signals from the first vernier alignment structure and the second vernier alignment structure; and
   wherein there exists a difference in alignment between the first vernier alignment structure and the second vernier alignment structure when the first semiconductor die is rotationally misaligned relative to the second semiconductor die.

5. The apparatus of claim 1, wherein the charging mechanism is further configured to assign different patterns of charges to the plurality of conductive elements on the first semiconductor die to achieve different resolutions in alignment between the first semiconductor die and the second semiconductor die.

6. The apparatus of claim 5, wherein the charging mechanism is further configured to:
   assign charges to the plurality of conductive elements on the first semiconductor die in a pattern that facilitates coarse resolution in the alignment between the first semiconductor die and the second semiconductor die; and upon reaching a coarse alignment, to assign charges to the plurality of conductive elements on the first semiconductor die in a pattern that facilitates fine resolution in the alignment between the first semiconductor die and the second semiconductor die.

7. The apparatus of claim 6, wherein the pattern that facilitates coarse resolution assigns charges of the same polarity to groups of adjacent conductive elements.

8. The apparatus of claim 6, wherein the pattern that facilitates fine resolution assigns charges of alternating polarity to adjacent conductive elements.

9. A method for measuring an alignment between a first semiconductor die and a second semiconductor die, comprising:

selectively charging a plurality of conductive elements on the first semiconductor die, wherein charging a conductive element on the first semiconductor die induces a charge in one or more conductive elements on the second semiconductor die when the conductive element on the first semiconductor die overlaps one or more conductive elements on the second semiconductor die;

amplifying signals induced in a plurality of conductive elements on the second semiconductor die;

wherein the plurality of conductive elements on the second semiconductor die have a different spacing than the plurality of conductive elements on the first semiconductor die, whereby a vernier alignment structure is created when the plurality of conductive elements on the first semiconductor die overlap the plurality of conductive elements on the second semiconductor die; and analyzing the amplified signals to determine the alignment between the first semiconductor die and the second semiconductor die.

10. The method of claim 9, wherein the plurality of conductive elements on the first semiconductor die and the plurality of conductive elements on the second semiconductor die are rectangular in shape.

11. The method of claim 9, further comprising determining rotational alignment between the first semiconductor die and the second semiconductor die.

12. The method of claim 11,
wherein the vernier alignment structure includes a first vernier alignment structure and a second vernier alignment structure, wherein the first vernier alignment structure is spatially separated from the second vernier alignment structure;

wherein determining rotational alignment between the first semiconductor die and the second semiconductor die involves comparing the amplified signals from the first vernier alignment structure and the second vernier alignment structure; and wherein there exists a difference in alignment between the first vernier alignment structure and the second vernier alignment structure when the first semiconductor die is rotationally misaligned relative to the second semiconductor die.

13. The method of claim 9, wherein selectively charging a plurality of conductive elements on the first semiconductor die further comprises assigning different patterns of charges to the plurality of conductive elements on the first semiconductor die to achieve different resolutions in alignment between the first semiconductor die and the second semiconductor die.

14. The method of claim 13, further comprising:
assigning charges to the plurality of conductive elements on the first semiconductor die in a pattern that facilitates coarse resolution in the alignment between the first semiconductor die and the second semiconductor die; and upon reaching a coarse alignment, assigning charges to the plurality of conductive elements on the first semiconductor die in a pattern that facilitates fine resolution in the alignment between the first semiconductor die and the second semiconductor die.

15. The method of claim 14, wherein the pattern that facilitates coarse resolution assigns charges of the same polarity to groups of adjacent conductive elements.

16. The method of claim 14, wherein the pattern that facilitates fine resolution assigns charges of alternating polarity to adjacent conductive elements.

17. A computer system, comprising:
a processor;
a memory;
a first semiconductor die, including a plurality of conductive elements;
a second semiconductor die, including a plurality of conductive elements;
wherein the plurality of conductive elements on the second semiconductor die have a different spacing than the plurality of conductive elements on the first semiconductor die, whereby a vernier alignment structure is created when the plurality of conductive elements on the first semiconductor die overlap the plurality of conductive elements on the second semiconductor die;
a charging mechanism configured to selectively charge each of the plurality of conductive elements on the first semiconductor die, wherein charging a conductive element on the first semiconductor die induces a charge in one or more conductive elements on the second semiconductor die when the conductive element on the first semiconductor die overlaps one or more conductive elements on the second semiconductor die; and
an amplification mechanism configured to amplify signals induced in the conductive elements on the second semiconductor die.

18. The computer system of claim 17, wherein the charging mechanism is further configured to assign different patterns of charges to the plurality of conductive elements on the first semiconductor die to achieve different resolutions in alignment between the first semiconductor die and the second semiconductor die.

19. The computer system of claim 18, wherein the charging mechanism is further configured to:
assign charges to the plurality of conductive elements on the first semiconductor die in a pattern that facilitates coarse resolution in the alignment between the first semiconductor die and the second semiconductor die; and upon reaching a coarse alignment, to assign charges to the plurality of conductive elements on the first semiconductor die in a pattern that facilitates fine resolution in the alignment between the first semiconductor die and the second semiconductor die.

20. The computer system of claim 19, wherein the pattern that facilitates coarse resolution assigns charges of the same polarity to groups of adjacent conductive elements.

21. The computer system of claim 19, wherein the pattern that facilitates fine resolution assigns charges of alternating polarity to adjacent conductive elements.

* * * * *